(12) United States Patent
Horikiri et al.

(10) Patent No.: US 11,342,191 B2
(45) Date of Patent: May 24, 2022

(54) STRUCTURE MANUFACTURING METHOD, STRUCTURE MANUFACTURING APPARATUS AND INTERMEDIATE STRUCTURE

(71) Applicants: SCIOCS COMPANY LIMITED, Hitachi (JP); SUMITOMO CHEMICAL COMPANY, LIMITED, Tokyo (JP)

(72) Inventors: Fumimasa Horikiri, Hitachi (JP); Noboru Fukuhara, Hitachi (JP); Taketomo Sato, Sapporo (JP); Masachika Toguchi, Sapporo (JP)

(73) Assignees: SCIOCS COMPANY LIMITED, Hitachi (JP); SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 17/289,199

(22) PCT Filed: Mar. 13, 2020

(86) PCT No.: PCT/JP2020/011152
§ 371 (c)(1),
(2) Date: Apr. 27, 2021

(87) PCT Pub. No.: WO2020/217769
PCT Pub. Date: Oct. 29, 2020

(65) Prior Publication Data
US 2021/0313186 A1 Oct. 7, 2021

(30) Foreign Application Priority Data

Apr. 26, 2019 (JP) .............................. JP2019-086053

(51) Int. Cl.
*H01L 21/306* (2006.01)
*C01G 15/00* (2006.01)
(Continued)

(52) U.S. Cl.
CPC ........ *H01L 21/30612* (2013.01); *C01G 15/00* (2013.01); *H01L 21/308* (2013.01);
(Continued)

(58) Field of Classification Search
None
See application file for complete search history.

(56) References Cited

U.S. PATENT DOCUMENTS

| 7,985,637 B2 | 7/2011 | Okamoto |
| 2006/0154391 A1 | 7/2006 | Tran et al. |
| 2014/0167059 A1 | 6/2014 | Hsu et al. |

FOREIGN PATENT DOCUMENTS

| JP | H07-161683 A | 6/1995 |
| JP | 2008-527717 A | 7/2008 |

(Continued)

OTHER PUBLICATIONS

J. Murata and S. Sadakuni, "Photo-electrochemical etching of free-stantding GaN wafer surfaces grown by hydride vapor phase epitaxy", lectrochimica Acta, vol. 171, pp. 89-95. (Year: 2015).*

(Continued)

*Primary Examiner* — Jiong-Ping Lu
(74) *Attorney, Agent, or Firm* — Foley & Lardner LLP

(57) ABSTRACT

There is provided a structure manufacturing method, including: preparing an etching target with at least one surface comprising group III nitride; then in a state where the etching target is immersed in an etching solution containing peroxodisulfate ions; irradiating the surface of the etching target with light through the etching solution, and generating sulfate ion radicals from the peroxodisulfate ions and gen- (Continued)

erating holes in the group III nitride, thereby etching the group III nitride, wherein in the etching of the group III nitride, the etching solution remains acidic during a period for etching the group III nitride by making the etching solution acidic at a start of etching the group III nitride, and the etching is performed, with a resist mask formed on the surface.

17 Claims, 6 Drawing Sheets

(51) Int. Cl.
    *H01L 21/308*     (2006.01)
    *H01L 21/67*     (2006.01)
    *H01L 33/32*     (2010.01)

(52) U.S. Cl.
    CPC .. *H01L 21/30604* (2013.01); *H01L 21/30617* (2013.01); *H01L 21/67086* (2013.01); *H01L 33/32* (2013.01)

(56) References Cited

FOREIGN PATENT DOCUMENTS

| | | |
|---|---|---|
| JP | 2012-178424 A | 9/2012 |
| JP | 2015-532009 A | 11/2015 |
| JP | 2017-195383 A | 10/2017 |
| WO | WO-2007/105281 A1 | 9/2007 |

OTHER PUBLICATIONS

L. Ma et al., "Comparison of different GaN etching techniques", CS Mantech Conference, Apr. 24-27, 2006, pp. 106-108. (Year: 2006).*

Murata et al., "Photo-electrochemical etching of free-standing GaN wafer surfaces grown by hydride vapor phase epitaxy," Electrochimica Acta, vol. 171, 2015, pp. 89-95.

Samukawa, Seiji, "Ultimate Top-down Etching Processes for Future Nanoscale Devices: Advanced Neutral-Beam Etching," Japanese Journal of Applied Physics, vol. 45, No. 4A, 2006, pp. 2395-2407.

Faraz et al., "Atomic Layer Etching: What CanWe Learn from Atomic Layer Deposition?" ECS Journal of Solid State Science and Technology, vol. 4 Issue 6, 2015, pp. N5023-N5032.

International Searching Authority, "International Search Report," issued in connection with International Patent Application No. PCT/JP2020/011152, dated Apr. 7, 2020.

International Searching Authority, "Written Opinion," issued in connection with International Patent Application No. PCT/JP2020/011152, dated Apr. 7, 2020.

International Preliminary Report on Patentability received in International Application No. PCT/JP2020/011152 dated Nov. 4, 2021 (11 pages).

* cited by examiner

FIG, 3(a)
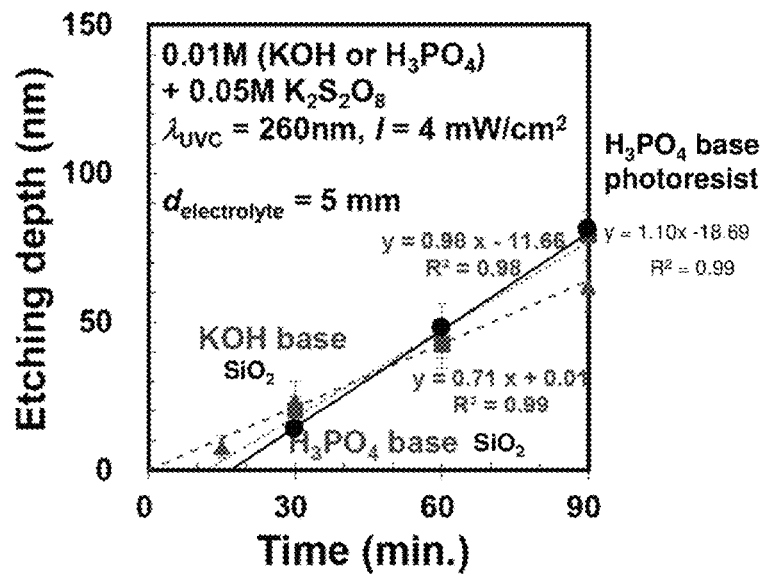
FIG. 3(b)
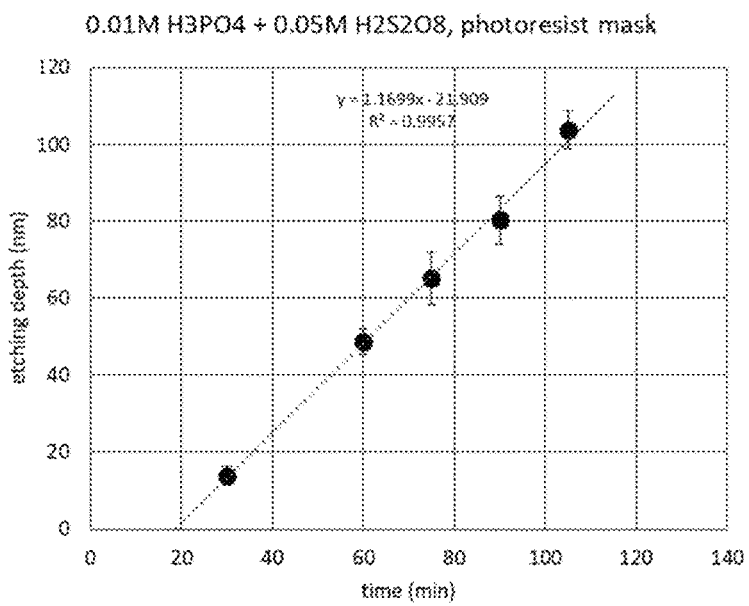

FIG. 5(a)

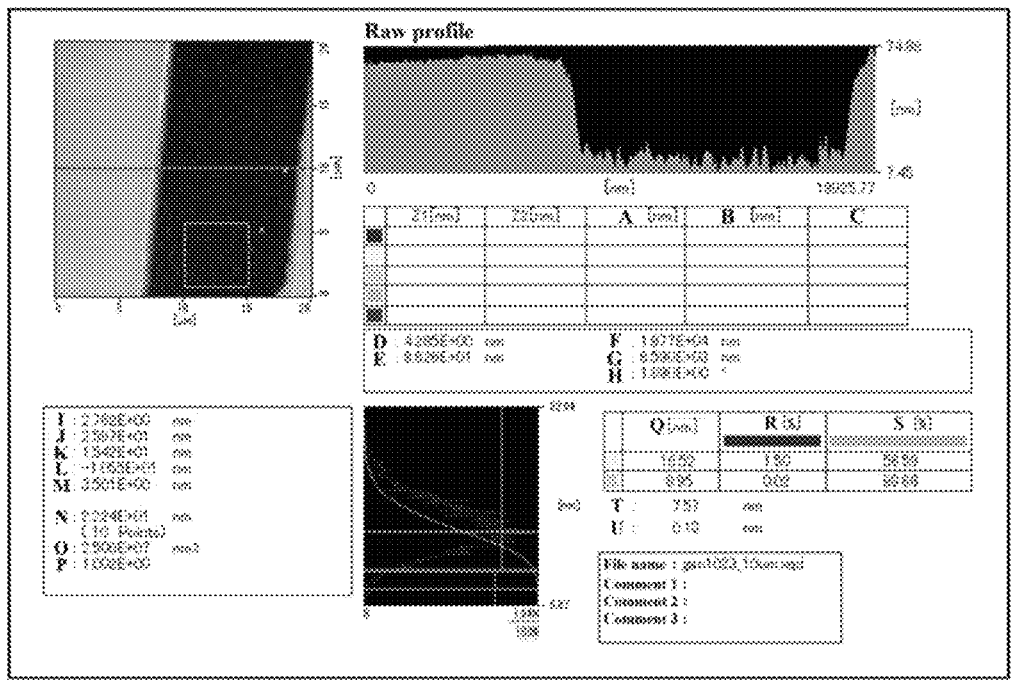

A = Height difference
B = Distance
C = Angle difference
D = Centerline average roughness
E = Maximum height difference
F = Measurement length
G = Cutoff value
H = Average tilt angle
I = Average surface roughness (Ra)
J = Maximum height difference (P-V)
K = Maximum mountain (Rp)
L = Maximum valley (Rv)
M = Root mean square roughness (RMS)
N = n point average roughness (Rz)
O = Surface area (S)
P = Surface area ratio (S ratio)
Q = Z value
R = Frequency distribution
S = Cumulative frequency distribution
T = Inter-peak distance
U = Section distance

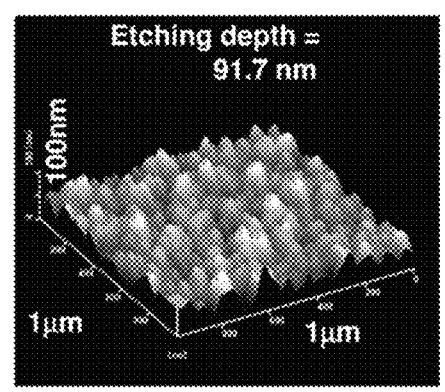

STRUCTURE MANUFACTURING METHOD, STRUCTURE MANUFACTURING APPARATUS AND INTERMEDIATE STRUCTURE

CROSS-REFERENCE TO RELATED APPLICATIONS

The present application claims priority under 37 U.S.C. § 371 to International Patent Application No. PCT/JP2020/011152, filed Mar. 13, 2020, which claims priority to and the benefit of Japanese Patent Application No. 2019-086053, filed Apr. 26, 2019. The contents of these applications are hereby incorporated by reference in their entireties.

TECHNICAL FIELD

The present invention relates to a structure manufacturing method, a structure manufacturing apparatus and an intermediate structure.

DESCRIPTION OF RELATED ART

Group III nitrides such as gallium nitride (GaN) are used as materials for manufacturing semiconductor devices such as light emitting devices and transistors.

Photoelectrochemical (PEC) etching has been proposed as an etching technique for forming various structures on group III nitrides such as GaN (see, for example, Non-Patent Document 1). The PEC etching is wet etching with less damage than general dry etching, and is preferable because an apparatus is simple, compared to special dry etching with less damage such as neutral particle beam etching (see, for example, Non-Patent Document 2) and atomic layer etching (see, for example, Non-Patent Document 3).

PRIOR ART DOCUMENT

Patent Document

[Non-Patent Document 1] J. Murata et al., "Photo-electrochemical etching of free-standing GaN wafer surfaces grown by hydride vapor phase epitaxy", Electrochimica Acta 171 (2015) 89-95
[Non-Patent Document 2] S. Samukawa, JJAP, 45 (2006) 2395.
[Non-Patent Document 3] T. Faraz, ECS J. Solid Stat. Scie. & Technol., 4, N5023 (2015).

SUMMARY OF THE INVENTION

Problem to be Solved by the Invention

An object of the present invention is to provide a technique capable of suppressing a temporal fluctuation of an etching condition in PEC etching applied to group III nitrides.

Means for Solving the Problem

According to an aspect of the present invention, there is provided a structure manufacturing method, including:
preparing an etching target with at least one surface comprising group III nitride;
then in a state where the etching target is immersed in an etching solution containing peroxodisulfate ions;
irradiating the surface of the etching target with light through the etching solution, and generating sulfate ion radicals from the peroxodisulfate ions and generating holes in the group III nitride, thereby etching the group III nitride,
wherein in the etching of the group III nitride, the etching solution remains acidic during a period for etching the group III nitride by making the etching solution acidic at a start of etching the group III nitride, and
the etching is performed, with a resist mask formed on the surface.

According to another aspect of the present invention, there is provided an intermediate structure, including:
an etching target with at least one surface comprising group III nitride; and
a resists mask formed on the surface,
and configured to be immersed in an acidic etching solution containing peroxodisulfate ions, with the resist mask formed on the surface.

Advantage of the Invention

There is provided a technique capable of suppressing a temporal fluctuation of an etching condition in PEC etching applied to group III nitrides.

BRIEF DESCRIPTION OF THE DRAWINGS

FIGS. 3 (a) and 3 (b) are graphs illustrating a result of a third experimental example.

FIG. 5 (a) is various data of AFM measurement illustrating a result of the fourth experimental example, and FIG. 5 (b) is an AFM image illustrating a result of the fourth experimental example.

DETAILED DESCRIPTION OF THE INVENTION

An Embodiment of the Present Invention

A structure manufacturing method according to an embodiment of the present invention will be described. A manufacturing method according to the present embodiment includes an etching step using photoelectrochemical (PEC) etching applied to an etching target 10 (hereinafter, also referred to as a wafer 10) which is a material of the structure (hereinafter, also referred to as PEC etching step). PEC etching is also simply referred to as etching.

Figure 1A:
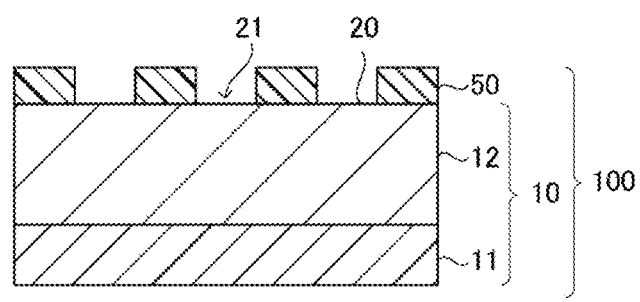
FIG. 1 (a) is a schematic cross-sectional view illustrating an etching target according to an embodiment of the present invention, and FIG. 1 (b) is a schematic view of a PEC etching apparatus illustrating a PEC etching step according to an embodiment.
Figure 1B:
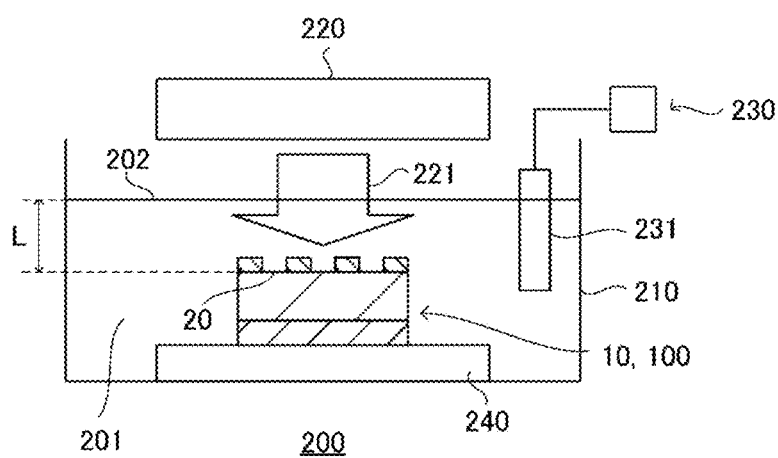

FIG. 1 (a) is a schematic cross-sectional view illustrating a wafer 10 to be PEC-etched. First, as illustrated in FIG. 1 (a), the wafer 10 is prepared. At least a surface 20 (a surface to be etched 20) of the wafer 10 comprises group III nitride.

A structure of the wafer 10 is not particularly limited. As an example of the structure of the wafer 10 (used in an experimental example described later), there is a laminated structure of an n-type gallium nitride (GaN) substrate 11 and an n-type GaN layer 12 epitaxially grown on the GaN substrate 11. The n-type GaN layer 12 has, for example, an n-type impurity concentration of $5 \times 10^{16}/cm^3$ and a thickness of 3 μm.

An object to be PEC-etched, that is, an object to be immersed (contacted) in an etching solution 201 is referred to as a treatment object 100. The treatment object 100 may have at least a wafer 10 and may further have, for example, a mask 50 as a member required in a PEC etching step. The mask 50 is formed in a pattern in which a region 21 to be etched is opened on a surface 20 to be etched of the wafer 10. A material of the mask 50 is not particularly limited as long as it can withstand the etching solution 201 and function as a mask, and for example, it may be a resist, for example, silicon oxide, for example, silicon nitride, or a metal such as titanium. A shape, width, etching depth, etc. of the region 21 to be etched may be appropriately selected as needed. The treatment object 100 can be regarded as an intermediate stage structure (intermediate structure) for obtaining a final structure.

FIG. 1 (b) is a schematic cross-sectional view of a PEC etching apparatus 200 illustrating the PEC etching step. The PEC etching apparatus 200 includes a container 210 for storing the etching solution 201 and a light source 220 for emitting ultraviolet (UV) light 221. The PEC etching apparatus 200 may include a support 240 on which the wafer 10 is placed at a predetermined height.

In the PEC etching step, etching treatment is applied to the group III nitride constituting the surface 20 to be etched, by irradiating the surface 20 to be etched with UV light 221 through the etching solution 201 in a state where the treatment object 100 (that is, the wafer 10) is immersed in the etching solution 201. Details of the etching solution 201, UV light 221 and a mechanism of the PEC etching will be described later.

The PEC etching apparatus 200 preferably further has a pH meter 230. The PEC etching step is preferably performed while measuring whether or not pH of the etching solution 201 is within an appropriate range, using the pH meter 230. At this time, it is preferable to arrange a probe 231 of the pH meter 230 at a position where a shadow of the probe 231 due to the UV light 221 is not reflected on the surface to be etched 20.

If necessary, the structure manufacturing method according to the present embodiment may include steps such as electrode formation and protective film formation as other steps.

Next, details of the etching solution 201, the UV light 221 and the mechanism of the PEC etching will be described. GaN is exemplified as the group III nitride to be etched.

The etching solution 201 containing oxygen used for producing an oxide of a group III element contained in the group III nitride constituting the surface to be etched 20, and further containing peroxodisulfate ions ($S_2O_8^{2-}$) as an oxidizing agent that receives electrons, is used as the etching solution 201. Further, the etching solution 201 that is acidic at a start of etching the group III nitride constituting the surface to be etched 20, is used as the etching solution 201 in the present embodiment.

First examples of the etching solution 201 include a mixture of an aqueous solution of potassium hydroxide (KOH) and an aqueous solution of potassium persulfate ($K_2S_2O_8$). Such an etching solution 201 is prepared, for example, by mixing a 0.001 M KOH aqueous solution and a 0.05 M $K_2S_2O_8$ aqueous solution in a ratio of 1:1. The concentration of the KOH aqueous solution, the concentration of the $K_2S_2O_8$ aqueous solution, and the mixing ratio of these aqueous solutions may be appropriately adjusted as necessary.

A simple KOH aqueous solution is alkaline, and a simple $K_2S_2O_8$ aqueous solution is acidic. Accordingly, if the concentration of the KOH aqueous solution is excessively high (for example, 0.01 M), the etching solution 201 in which the KOH aqueous solution and the $K_2S_2O_8$ aqueous solution are mixed becomes alkaline. (Such an alkaline etching solution 201 is also hereinafter referred to as a reference example of the etching solution 201). As the etching solution 201 of the first example, the etching solution 201, which is a mixture of the KOH aqueous solution and the $K_2S_2O_8$ aqueous solution, becomes acidic by appropriately lowering the concentration of the KOH aqueous solution.

The PEC etching mechanism at the time of using the etching solution 201 of the first example will be described. Holes and electrons are generated as a pair in the GaN constituting the surface to be etched 20, by irradiating the wafer 10 with UV light 221 having a wavelength of 365 nm or less. Gallium oxide ($Ga_2O_3$) is generated by decomposing the Gan into $Ga^{3+}$ and $N_2$ by the generated holes (Chemical formula 1) and further by oxidizing $Ga^{3+}$ by hydroxide ions ($OH^-$) (Chemical formula 2). Then, the generated $Ga_2O_3$ is dissolved in an acid (or alkali). In this way, PEC etching of GaN is performed. The generated holes react with water and the water is decomposed to generate oxygen (Chemical Formula 3).

$GaN(s)+3h^+ \rightarrow Ga^{3+}+\frac{1}{2}N_2(g)\uparrow$ [Chemical formula 1]

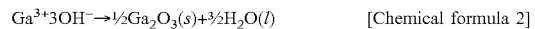
$Ga^{3+}+3OH^- \rightarrow \frac{1}{2}Ga_2O_3(s)+\frac{3}{2}H_2O(l)$ [Chemical formula 2]

$H_2O(l)+2h^+ \rightarrow \frac{1}{2}O_2(g)\nabla+2H^+$ [Chemical formula 3]

Further, sulfate ion radical ($SO_4^{-*}$ radical) is generated by dissolving $K_2S_2O_8$ in water (Chemical formula 4), and peroxodisulfate ion ($S_2O_8^{2-}$) is generated by irradiating $S_2O_8^{2-}$ with UV light 221 (Chemical formula 5). The electrons generated in pairs with holes react with water together with $SO_4^{-*}$ radicals, and the water is decomposed to generate hydrogen (Chemical formula 6). At this time, the acidity of the etching solution 201 becomes stronger, due to generation of the sulfate ions ($SO_4^{2-}$). As described above, in the PEC etching of the present embodiment, by using $SO_4^{-*}$ radicals, the electrons generated in pairs with holes can be consumed in GaN, and therefore PEC etching can progress satisfactorily. Then, as the PEC etching progresses, the acidity of the etching solution 201 becomes stronger (pH decreases).

$K_2S_2O_8 \rightarrow 2K^++S_2O_8^{2-}$ [Chemical 4]

$S_2O_8^{2-}+\text{heat or } h\nu \rightarrow 2SO_4^{-*}$ [Chemical 5]

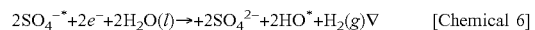
$2SO_4^{-*}+2e^-+2H_2O(l) \rightarrow +2SO_4^{2-}+2HO^*+H_2(g)\nabla$ [Chemical 6]

Second examples of the etching solution 201 include a mixture of a phosphoric acid ($H_3PO_4$) aqueous solution and a potassium persulfate ($K_2S_2O_8$) aqueous solution. Such an etching solution 201 is prepared, for example, by mixing a 0.01 M $H_3PO_4$ aqueous solution and a 0.05 M $K_2S_2O_8$ aqueous solution in a ratio of 1:1. The concentration of the $H_3PO_4$ aqueous solution, the concentration of the $K_2S_2O_8$ aqueous solution, and the mixing ratio of these aqueous solutions may be appropriately adjusted as necessary.

Both the $H_3PO_4$ aqueous solution and the $K_2S_2O_8$ aqueous solution are acidic. Accordingly, as a second example, the etching solution in which the $H_3PO_4$ aqueous solution and the $K_2S_2O_8$ aqueous solution are mixed is acidic at an arbitrary mixing ratio.

Regarding the PEC etching mechanism in the case of using the etching solution 201 of the second example, it is considered that (Chemical formula 1) to (Chemical formula 3) described in the case of using the etching solution 201 of the first example are replaced with (Chemical formula 7). That is, $Ga_2O_3$, hydrogen ions ($H^+$), and $N_2$ are generated by the reaction of GaN, holes generated by irradiation with UV light 221 and water (Chemical formula 7). Then, the generated $Ga_2O_3$ is dissolved in acid. In this way, PEC etching of GaN is carried out. The mechanism in which the electrons generated in pairs with holes are consumed by $S_2O_8^{2-}$ as shown in (Chemical formula 4) to (Chemical formula 6) is the same as in the case of using the etching solution 201 of the first example.

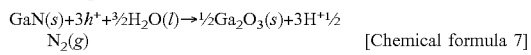
[Chemical formula 7]

As shown in (Chemical formula 5), at least one of irradiation with UV light 221 and heating can be used as a method for producing $SO_4^-$* radicals from $S_2O_8^{2-}$. When using irradiation with UV light 221, in order to increase the light absorption by $S_2O_8^{2-}$ and efficiently generate $SO_4^-$* radicals, a wavelength of the UV light 221 is preferably 200 nm or more and less than 310 nm. That is, from a viewpoint of efficiently producing holes in the group III nitride in the wafer 10 and producing $SO_4^-$* radicals from $S_2O_8^{2-}$ in the etching solution 201 by irradiation with UV light 221, the wavelength of the UV light 221 is preferably 200 nm or more and less than 310 nm. When the generation of $SO_4^-$* radicals from $S_2O_8^{2-}$ is carried out by heating, the wavelength of the UV light 221 may be 310 nm or more (365 nm or less).

When producing $SO_4^-$* radicals from $S_2O_8^{2-}$ by irradiation with UV light 221, a distance L from the surface to be etched 20 of the wafer 10 to an upper surface 202 of the etching solution 201 is preferably, for example, 5 mm or more and 100 mm or less. When the distance L is excessively short, for example, less than 5 mm, an amount of $SO_4^-$* radicals generated in the etching solution 201 above the wafer 10 may become unstable due to fluctuations in the distance L. Further, when the distance L is excessively long, for example, over 100 mm, in the etching solution 201 above the wafer 10, a large amount of $SO_4^{+}$* radicals that do not contribute to PEC etching are unnecessarily generated, and therefore utilization efficiency of the etching solution 201 is reduced.

Figure 2A:
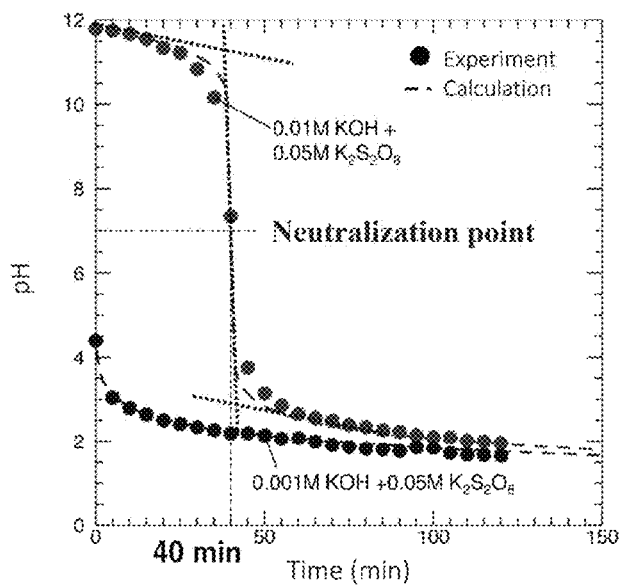
FIG. 2 (a) is a graph illustrating a result of a first experimental example, and FIG. 2 (b) is a graph illustrating a result of a second experimental example.
Figure 2B:
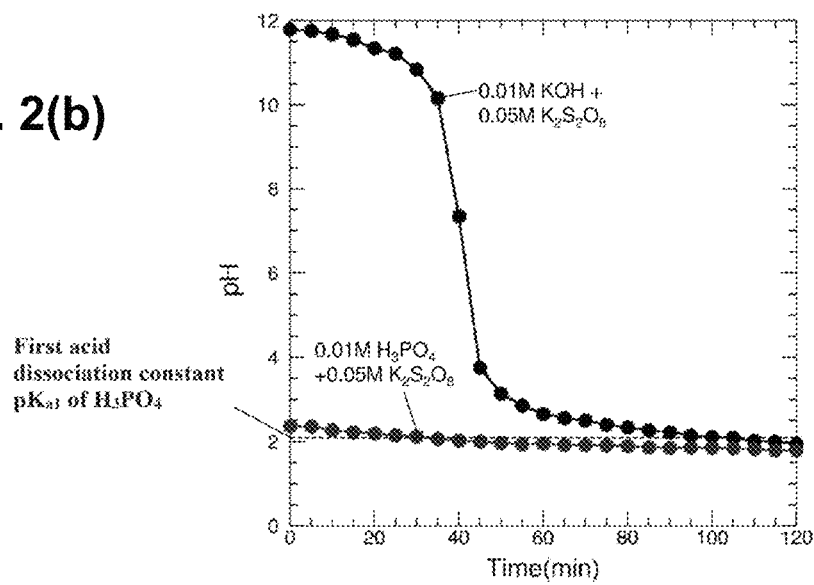

Next, an experimental example relating to PEC etching of the present embodiment will be described. FIGS. 2 (a) and 2 (b) are graphs illustrating the results of a first experimental example and a second experimental example, respectively. Further, FIGS. 2 (a) and 2 (b) also illustrate the results of the reference experimental examples, respectively.

In the first experimental example, the etching solution 201 in which 0.001 M KOH aqueous solution and 0.05 M $K_2S_2O_8$ aqueous solution described as the etching solution 201 of the first example were mixed at a ratio of 1:1, was used. In the second experimental example, the etching solution 201 in which 0.01 M $H_3PO_4$ aqueous solution and 0.05 M $K_2S_2O_8$ aqueous solution described as the etching solution 201 of the second example were mixed at a ratio of 1:1, was used. In the reference experimental examples, the etching solution 201 in which 0.01 M KOH aqueous solution and 0.05 M $K_2S_2O_8$ aqueous solution described as the etching solution 201 of the reference examples were mixed at a ratio of 1:1, was used.

In this experimental example, by irradiating the etching solution 201 with UV light 221, how the pH of the etching solution changed with time, was measured. UV light 221 having a peak wavelength of 260 nm was emitted. Also, in this experimental example, the wafer 10 is not immersed in the etching solution to perform PEC etching, and only the pH change of the etching solution is measured. However, even when PEC etching is performed, the pH change of the etching solution is considered to be almost the same.

In FIGS. 2 (a) and 2 (b), the horizontal axis indicates the time from the start of irradiation of the UV light 221 and the vertical axis indicates the pH of the etching solution 201. The time on the horizontal axis can be regarded as the time from the start of PEC etching.

As illustrated in FIG. 2 (a), in the reference experimental example, the etching solution 201 of the reference example has a pH of about 12 and is alkaline at the start of etching. As described above, since $SO_4^{2-}$ in the etching solution 201 increases due to irradiation with UV light 221, the longer the etching time, the lower the pH of the etching solution 201. The etching solution 201 of the reference example has a pH of 7 and becomes neutral when the etching time is 40 minutes, and becomes acidic thereafter.

PEC etching progresses by dissolving the generated $Ga_2O_3$ in an alkali or an acid. Accordingly, in the reference experimental example, the etching does not progress while the etching solution 201 is in the vicinity of neutrality. Further, in the reference experimental example, since the pH of the etching solution 201 fluctuates greatly with time, dissolution conditions of $Ga_2O_3$ fluctuate greatly with time. Accordingly, it is difficult to maintain a temporal uniformity of the PEC etching.

As illustrated in FIG. 2 (a), in the first experimental example, the etching solution 201 of the first example has a pH of 4.4 and is acidic at the start of etching. Accordingly, the etching solution 201 of the first example has been acidic since the start of etching. Therefore, by using the etching solution 201 of the first example, it is possible to prevent the PEC etching from progressing due to the neutralization of the etching solution 201. Further, compared with the case of using the etching solution 201 of the reference example, a fluctuation range of pH during the etching period can be reduced.

As illustrated in FIG. 2 (b), in the second experimental example, the etching solution 201 of the second example has a pH of 2.3 and is acidic at the start of etching. Accordingly, the etching solution 201 of the second example, like the etching solution 201 of the first example, is acidic from the start of etching. Therefore, by using the etching solution 201 of the second example, similarly to the etching solution 201 of the first example, PEC etching can be prevented from progressing due to the neutralization of the etching solution 201, and compared with the case of using the etching solution 201 of the reference example, the fluctuation range of pH during the etching period can be reduced.

As described above, in the present embodiment, by using the acidic etching solution 201 at the start of etching as in the first and second examples, the etching solution 201 is maintained in an acidic state for an entire etching period. As a result, PEC etching can be prevented from progressing due to the neutralization of the etching solution 201. Further, compared with a mode in which the etching solution 201 changes from alkaline to acidic during the etching period, as in the case of using the etching solution 201 of the reference example, the fluctuation range of pH during the etching period can be reduced.

Further, it is preferable that the etching solution 201 is maintained in an acidic state from a viewpoint of facilitating the use of the resist mask as the mask 50. In contrast, when the etching solution 201 is alkaline, the resist is easily peeled off, so it is difficult to use the resist mask as the mask 50. When using the acidic etching solution 201, if necessary, a mask material other than the resist (silicon oxide, silicon nitride, etc.) may be used.

The following mode can also be considered. PEC etching is prevented from progressing by continuing to replace the etching solution 201 before reaching neutrality so that the etching solution 201 of the reference example remains alkaline. However, in this mode, it is troublesome to replace the etching solution 201. Even without replacing the etching solution 201, by using the etching solutions 201 of the first example and the second example, it becomes easy to perform PEC etching for a long time (for example, preferably 30 minutes, more preferably 60 minutes, still more preferably 90 minutes or more, still more preferably 120 minutes or more) without replacing the etching solution 201, that is, using the same etching solution 201.

Further, by not replacing the etching solution 201, it is possible to prevent the etching solution 201 from being stirred. By not stirring the etching solution 201, it is possible to improve the temporal uniformity of a supply state of $S_2O_8^{2-}$, $SO_4^{-*}$ radicals, etc. to the surface to be etched 20.

Therefore, it becomes easy to improve a flatness of the etched surface (improve in-plane uniformity). This is also an advantage when performing etching for a long time. In the present embodiment, it is not essential to keep the etching solution 201 stationary, and if necessary, PEC etching may be performed while flowing the (acidic) etching solution 201. When the etching solution 201 is flown, the same etching solution 201 may be circulated (the etching solution 201 is not replaced), or a new etching solution 201 may be continuously supplied (the etching solution 201 is replaced).

Further, the following effects can be obtained by using the etching solution 201 of the second example. The etching solution 201 of the second example contains $H_3PO_4$ as an example of a weak acid having an acid dissociation constant $pK_a$ of more than 0 and less than 7. By using the etching solution 201 of the second example, a buffering action of the weak acid can be utilized in an acidic region where the pH is more than 0 and less than 7, and therefore it becomes easy to reduce the lowering range of pH during the etching period, in other words, to bring the pH during the etching period close to a constant level. A first acid dissociation constant $pK_{a1}$ of $H_3PO_4$ is 2.12.

Accordingly, by using the etching solution 201 of the second example, the temporal fluctuation of the pH of the etching solution 201 can be further reduced, compared with the mode using the etching solution 201 of the first example, and therefore the temporal fluctuation in dissolution conditions of $Ga_2O_3$ can be reduced. Accordingly, it becomes easier to maintain the temporal uniformity of the PEC etching.

From a viewpoint of reducing the temporal fluctuation of the pH of the etching solution 201, the following can be said as a guideline. A lowering range of the pH of the etching solution 201 at the end of etching with respect to the pH of the etching solution 201 at the start of etching is, for example, preferably 4 or less, more preferably 3 or less, still more preferably 2 or less, still more preferably 1.5 or less, still more preferably 1 or less.

Further, from this point of view, the following can be said as another guideline. When all $S_2O_8^{2-}$ contained in the etching solution 201 is changed to $SO_4^{2-}$, the lowering range of the pH of the etching solution 201 with respect to the pH of the etching solution 201 at the start of etching is, for example, preferably 4 or less, more preferably 3 or less, still more preferably 2 or less, still more preferably 1.5 or less, still more preferably 1 or less.

In the etching solutions 201 of the first example and the second example, the pH of the etching solution 201 when all $S_2O_8^{2-}$ is changed to $SO_4^{2-}$ (that is, extreme pH when the etching time is lengthened) is about 1.5.

When a weak acid is contained as in the etching solution 201 of the second example, it is more preferable to select the following conditions. A difference in the pH of the etching solution 201 at the start of etching with respect to the acid dissociation constant $pK_a$ of the weak acid is, preferably plus or minus 1 or less, and more preferably plus or minus 0.5 or less. The buffering action of the weak acid is large in the vicinity of the acid dissociation constant $pK_a$ of the weak acid. Therefore, by reducing the difference between the pH of the etching solution 201 at the start of etching and the acid dissociation constant $pK_a$ of the weak acid, it becomes easy to utilize the buffering action of the weak acid.

Further, the pH of the etching solution 201 at the start of etching is preferably higher than the acid dissociation constant $pK_a$ of the weak acid. As a result, as the PEC etching progresses, the pH of the etching solution 201 lowers and approaches the acid dissociation constant $pK_a$ of the weak acid. Therefore, it becomes easy to utilize the buffering action of the weak acid for a longer period of time.

Further, the acid dissociation constant $pK_a$ of the weak acid contained in the etching solution 201 is preferably higher than the pH of the etching solution 201 (hereinafter, also referred to as extreme pH) when all $S_2O_8^{2-}$ contained in the etching solution 201 is changed to $SO_4^{2-}$. As a result, the buffering action of the weak acid can be utilized while the pH of the etching solution 201 is approaching the extreme pH.

FIGS. 3 (a) and 3 (b) are graphs illustrating the results of the third experimental example, showing a relationship between an etching time and an etching depth in PEC etching under various conditions. A slope of the graph indicates an etching rate.

FIG. 3 (a) illustrates a result of etching the treatment object 100 on which the mask 50 made of silicon oxide ($SiO_2$) is formed, using the etching solution 201 of the reference example (square plot), a result of etching the treatment object 100 on which the mask 50 made of silicon oxide is formed, using the etching solution 201 of the second example (triangular plot), and a result of etching the treatment object 100 on which the mask 50 made of resist is formed, using the etching solution 201 of the second example (circular plot). A wavelength ($\lambda_{UVC}$) of the UV light 221 was 260 nm, and irradiation intensity (I) was 4 mW/cm$^2$. Distance L ($d_{ejectorite}$) from the surface 20 to be etched to the upper surface 202 of the etching solution 201 was 5 mm.

In the case of using the etching solution 201 of the reference example and the case of using the etching solution 201 of the second example, it is found that PEC etching can be performed at approximately the same etching rate. Further, when the etching solution 201 of the second example is used, it is found that PEC etching can be performed at approximately the same etching rate, whether the mask 50 is made of silicon oxide or resist. Since the etching solution 201 of the reference example is alkaline, it is difficult to use the mask 50 made of resist.

FIG. 3 (b) illustrates other result of etching the treatment object 100 on which the mask 50 made of resist was formed, using the etching solution 201 of the second example. Similarly to the result shown in FIG. 3 (a), it is found that PEC etching using the resist mask can be satisfactorily performed by using the etching solution 201 of the second example.

Figure 4A:
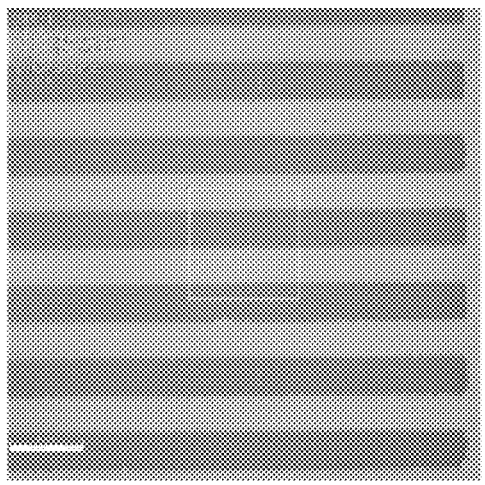
FIG. 4 (a) is a laser microscope image illustrating a result of a fourth experimental example, and FIG. 4 (b) is an SEM image illustrating a result of the fourth experimental example.
Figure 4B:
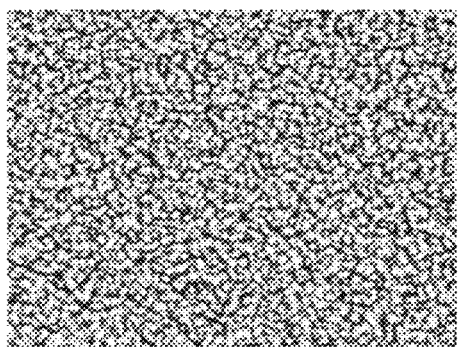

Next, a fourth experimental example will be described. FIG. 4 (a) illustrates a laser microscope image showing a result of forming a resist mask with a line-and-space pattern with a width of 10 μm and performing PEC etching using the etching solution 201 (using phosphoric acid) of the second example. A dark region of the laser microscope image indicates an etched region.

FIG. 4 (b) is a scanning electron microscope (SEM) image of the etched region in the sample illustrated in FIG. 4 (a). A root mean square (RMS) surface roughness of the etched region in a 5 μm square region was 2.76 nm.

FIG. 5 (a) illustrates various data measured by an atomic force microscope (AFM) in the sample illustrated in FIG. 4 (a). FIG. 5 (b) illustrates an AFM image of another sample in which the resist mask was formed and etched using the etching solution 201 (using phosphoric acid) of the second example.

According to these experimental examples, it is found by the present inventors that PEC etching can be performed using the etching solution 201 that contains $S_2O_8^{2-}$ as an oxidizing agent that receives electrons and is acidic from the start of etching. Further, it is also found that in order to prepare such an etching solution 201, for example, phosphoric acid, which is a weak acid, can be preferably used. Further, it is also found that by using such an etching solution 201, PEC etching can be satisfactorily performed using the resist mask. It has not been proposed so far that PEC etching is performed using such an etching solution 201 and the resist mask is used for the PEC etching, and the inventor of the present application proposes it for the first time.

As described above, according to the present embodiment, by performing PEC etching using the etching solution 201 that is acidic from the start of etching, PEC etching in which temporal fluctuation in etching conditions are suppressed, can be performed, compared with a case where PEC etching is performed using the etching solution 201 which is alkaline at the start of etching. Further, by using such an acidic etching solution 201, it becomes easy to use a resist mask as the mask 50.

Modified Example

Next, a modified example of the above-described embodiment will be described. The above-described embodiment shows a mode in which by using the etching solution 201 of the first example (FIG. 2 (a)), the pH at the start of etching becomes higher than that of the case of using the etching solution 201 of the second example (FIG. 2 (b)), that is, shows a mode in which the fluctuation range of pH during the etching period becomes large. This modified example shows a mode in which the pH at the start of etching can be lowered even by using the etching solution 201 of the first example, that is, shows a mode in which the fluctuation range of pH during the etching period can be small.

Figure 6:
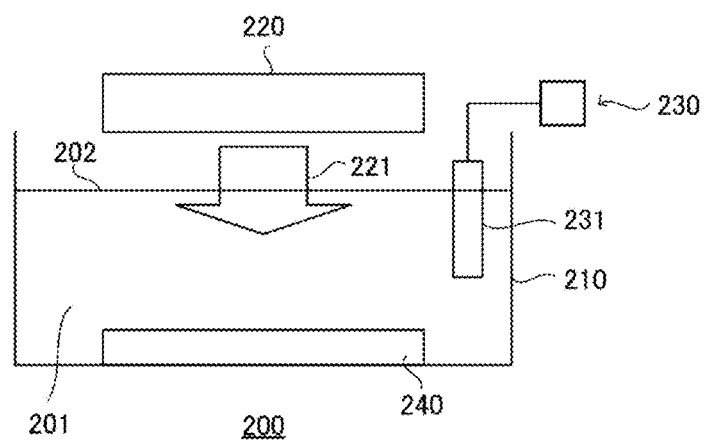
FIG. 6 is a schematic view of a PEC etching apparatus illustrating a pretreatment step according to a modified example.

FIG. 6 is a schematic view of a PEC etching apparatus 200, illustrating a pretreatment step added in this modified example. The pretreatment step is the step of lowering the pH of the etching solution 201 by irradiating the etching solution 201 with UV light 221 to change a part of $S_2O_8^{2-}$ to $SO_4^{2-}$, in a state where the wafer 10 is not immersed in the etching solution 201, before etching the wafer 10 (FIG. 1 (b)).

Specifically, for example, as can be seen from FIG. 2 (a), when the etching solution 201 of the first example is used, by irradiating with UV light 221 for 20 minutes before the start of etching, the pH of the etching solution 201 is lowered to 2.5. Thereafter, by immersing the wafer 10 in the etching solution 201 and starting etching, pH at the start of etching becomes, for example, 2.5.

In this modified example, by the pretreatment step, the pH of the etching solution 201 is lowered to a predetermined pH in advance, and then etching is started. As a result, the lowering range of pH can be reduced from the start of etching to the end of etching as compared with a case where the pretreatment step is not performed, and therefore fluctuation in etching conditions can be suppressed.

Other Embodiments

As described above, the embodiments and the modified examples of the present invention have been specifically described. However, the present invention is not limited to the above-described embodiments and modified examples, and various modifications, improvements, combinations, and the like can be made without departing from the gist thereof.

For example, the etching solution 201 containing $S_2O_8^{2-}$ and being acidic at the start of etching is not limited to those of the first and second examples described above. As such an etching solution 201, for example, the $K_2S_2O_8$ aqueous solution alone can also be used. In this case, the concentration of the $K_2S_2O_8$ aqueous solution may be, for example, 0.025M.

Further, in the above description, the mode in which $S_2O_8^{2-}$ is supplied from potassium persulfate ($K_2S_2O_8$) has been exemplified. However, $S_2O_8^{2-}$ may be supplied from other sources such as sodium peroxodisulfate ($Na_2S_2O_8$), ammonium peroxodisulfate (ammonium persulfate, $(NH_4)_2S_2O_8$) and the like.

PEC etching can also be applied to the group III nitride other than the exemplified GaN. A group III element contained in the group III nitride is at least one of aluminum (Al), gallium (Ga) and indium (In). The concept of PEC etching applied to Al component or In component in the group III nitride is the same as the concept described for the Ga component with reference to (Chemical formula 1) and (Chemical formula 2), or (Chemical formula 7). That is, PEC etching can be performed by generating holes by irradiation with UV light 221 to generate an oxide of Al or an oxide of In, and by dissolving these oxides in an acid (or alkali). A peak wavelength (365 nm or less) of the UV light 221 may be appropriately changed depending on the composition of the group III nitride to be etched. Based on PEC etching of GaN, when Al is contained, UV light having a shorter wavelength may be used, and when In is contained, UV light having a longer wavelength can also be used. Impurities such as conductive type determining impurities may be added to the group III nitride to be PEC-etched, if necessary.

<Preferable Aspect of the Present Invention>

Hereinafter, preferable aspects of the present invention will be supplementarily described.

(Supplementary Description 1)
There is provided a structure manufacturing method, including:
preparing an etching target with at least one surface comprising group III nitride:
then in a state where the etching target is immersed in an etching solution containing peroxodisulfate ions;
irradiating the surface of the etching target with light through the etching solution, and generating sulfate ion radicals from the peroxodisulfate ions and generating holes in the group III nitride, thereby etching the group III nitride,
wherein in the etching of the group III nitride, the etching solution remains acidic during a period for etching the group III nitride by making the etching solution acidic at a start of etching the group III nitride.

(Supplementary Description 2)
There is provided the structure manufacturing method according to the supplementary description 1, wherein a lowering range of pH of the etching solution at the end of etching with respect to pH of the etching solution at the start of etching is, for example, preferably 4 or less, more preferably 3 or less, still more preferably 2 or less, still more preferably 1.5 or less, still more preferably 1 or less.

(Supplementary Description 3)
There is provided the structure manufacturing method according to the supplementary description 1 or 2, wherein a lowering range of pH of the etching solution when all the peroxodisulfate ions contained in the etching solution are changed to sulfate ions, with respect to pH of the etching solution at the start of etching, is preferably 4 or less, more preferably 3 or less, still more preferably 2 or less, still more preferably 1.5 or less, still more preferably 1 or less.

(Supplementary Description 4)
There is provided the structure manufacturing method according to any one of the supplementary descriptions 1 to 3, wherein the etching solution contains a weak acid having an acid dissociation constant $pK_a$ of more than 0 and less than 7.

(Supplementary Description 5)
There is provided the structure manufacturing method according to the supplementary description 4, wherein the weak acid is phosphoric acid.

(Supplementary Description 6)
There is provided the structure manufacturing method according to the supplementary description 4 or 5, wherein a difference between pH of the etching solution at the start of etching and the acid dissociation constant $pK_a$ of the weak acid, is preferably plus or minus 1 or less, more preferably plus or minus 0.5 or less.

(Supplementary Description 7)
There is provided the structure manufacturing method according to any one of the supplementary descriptions 4 to 6, wherein the pH of the etching solution at the start of etching is higher than the acid dissociation constant $pK_a$ of the weak acid.

(Supplementary Description 8)
There is provided the structure manufacturing method according to any one of the supplementary descriptions 4 to 7, wherein the acid dissociation constant $pK_a$ of the weak acid is higher than the pH of the etching solution when all the peroxodisulfate ions contained in the etching solution are changed to sulfate ions.

(Supplementary Description 9)
There is provided the structure manufacturing method according to any one of the supplementary descriptions 1 to 8, wherein the etching solution is not replaced during a period for etching the group III nitride.

(Supplementary Description 10)
There is provided the structure manufacturing method according to any one of the supplementary descriptions 1 to 9, wherein the etching solution is not stirred during the period for etching the group III nitride.

(Supplementary Description 11)
There is provided the structure manufacturing method according to any one of the supplementary descriptions 1 to 10, wherein the period for etching the group III nitride is preferably 30 minutes, more preferably 60 minutes, still more preferably 90 minutes or more, still more preferably 120 minutes or more.

(Supplementary Description 12)
There is provided the structure manufacturing method according to any one of the supplementary descriptions 1 to 11, wherein the pH of the etching solution is measured during the period for etching the group III nitride.

(Supplementary Description 13)
There is provided the structure manufacturing method according to the supplementary description 12, wherein a probe of a pH meter is placed at a position where a shadow of the probe due to the UV light is not reflected on the surface of the etching target, when measuring pH of the etching solution.

(Supplementary Description 14)
There is provided the structure manufacturing method according to any one of the supplementary descriptions 1 to 13, further including before etching the group III nitride:
lowering pH of the etching solution by irradiating the etching solution with UV light to change a part of the peroxodisulfate ions to sulfate ions, in a state where the etching target is not immersed in the etching solutione.

(Supplementary Description 15)
There is provided the structure manufacturing method according to any one of the supplementary descriptions 1 to 14, wherein in the etching of the group III nitride, the etching is performed, with a mask formed on the surface (on a part of the surface).

(Supplementary Description 16)
There is provided the structure manufacturing method according to the supplementary description 15, wherein the mask is a resist mask.

(Supplementary Description 17)
There is provided an intermediate structure, including:
an etching target with at least one surface comprising group III nitride; and
a mask formed on the surface (on a part of the surface), and immersed in an acidic etching solution containing peroxodisulfate ions.

(Supplementary Description 18)
There is provided the intermediate structure according to the supplementary description 17, wherein the mask is a resist mask.

(Supplementary Description 19)
The intermediate structure according to the supplementary description 17 or 18, wherein the surface is irradiated with UV light through the etching solution.

DESCRIPTION OF SIGNS AND NUMERALS

10 Etching target
20 Surfaces 20 to be etched
21 Region 21 to be etched
50 Mask
100 Treatment object
200 PEC etching apparatus
201 Etching solution 202 Upper surface of the etching solution
210 Container
220 Light source
221 UV light
230 pH meter
231 Probe
240 Support

The invention claimed is:

1. A structure manufacturing method, comprising:
preparing an etching target with at least one surface comprising group III nitride;
then in a state where the etching target is immersed in an etching solution containing peroxodisulfate ions;
irradiating the surface of the etching target with light through the etching solution, and generating sulfate ion radicals from the peroxodisulfate ions and generating holes in the group III nitride, thereby etching the group III nitride,
wherein in the etching of the group III nitride, the etching solution remains acidic during a period for etching the group III nitride by making the etching solution acidic at a start of etching the group III nitride, and
the etching is performed, with a resist mask formed on the surface.

2. The structure manufacturing method according to claim 1, wherein a lowering range of pH of the etching solution at an end of the etching with respect to pH of the etching solution at a start of etching, is 4 or less.

3. The structure manufacturing method according to claim 1, wherein a lowering range of the pH of the etching solution when all the peroxodisulfate ions contained in the etching solution are changed to sulfate ions, with respect to the pH of the etching solution at the start of etching, is 4 or less.

4. The structure manufacturing method according to claim 1, wherein the etching solution contains a weak acid having an acid dissociation constant $pK_a$ of more than 0 and less than 7.

5. The structure manufacturing method according to claim 4, wherein the weak acid is phosphoric acid.

6. The structure manufacturing method according to claim 4, wherein a difference between the pH of the etching solution at the start of etching and the acid dissociation constant $pK_a$ of the weak acid is plus or minus 1 or less.

7. The structure manufacturing method according to claim 4, wherein the pH of the etching solution at the start of etching is higher than the acid dissociation constant $pK_a$ of the weak acid.

8. The structure manufacturing method according to claim 4, wherein the acid dissociation constant $pK_a$ of the weak acid is higher than the pH of the etching solution when all the peroxodisulfate ions contained in the etching solution are changed to sulfate ions.

9. The structure manufacturing method according to claim 1, wherein the etching solution is not replaced during the period for etching the group III nitride.

10. The structure manufacturing method according to claim 1, wherein the etching solution is not stirred during the period for etching the group III nitride.

11. The structure manufacturing method according to claim 1, wherein the period for etching the group III nitride is 30 minutes or more.

12. The structure manufacturing method according to claim 1, wherein the pH of the etching solution is measured during the period for etching the group III nitride.

13. The structure manufacturing method according to claim 12, wherein a probe of a pH meter is placed at a position where a shadow of the probe due to the light is not reflected on the surface of the etching target, when measuring the pH of the etching solution.

14. The structure manufacturing method according to claim 1, further comprising before the etching of the group III nitride:
lowering the pH of the etching solution by changing a part of the peroxodisulfate ions to sulfate ions by irradiating the etching solution with light in a state where the etching target is not immersed in the etching solution.

15. The structure manufacturing method according to claim 1, wherein the sulfate ion radicals are generated by heating.

16. The structure manufacturing method according to claim 15, wherein a wavelength of the light is 310 nm or more.

17. A structure manufacturing method, comprising:
preparing an etching target with at least one surface comprising group III nitride;
then in a state where the etching target is immersed in an etching solution containing peroxodisulfate ions;
irradiating the surface of the etching target with light through the etching solution, and generating sulfate ion radicals from the peroxodisulfate ions and generating holes in the group III nitride, thereby etching the group III nitride,
wherein in the etching of the group III nitride, the etching solution remains acidic during a period for etching the group III nitride by making the etching solution acidic at a start of etching the group III nitride, and
the etching is performed so that a root mean square surface roughness in a 5 μm square region of the surface etched by the irradiation of light is 2.76 nm or less.

* * * * *